United States Patent
Grenier et al.

(10) Patent No.: US 9,733,325 B2
(45) Date of Patent: Aug. 15, 2017

(54) METHOD FOR CHARACTERIZING A SAMPLE BY NMR SPECTROSCOPY WITH ACQUISITION DURING THE GENERATION OF A RADIOFREQUENCY MAGNETIC FIELD

(75) Inventors: Denis Grenier, Lyons (FR); Herve Saint-Jalmes, Rennes (FR)

(73) Assignees: CENTRE NATIONAL DE LA RECHERCHE SCIENTIFIQUE (CNRS), Paris (FR); UNIVERSITE DE RENNES 1, Rennes (FR)

( * ) Notice: Subject to any disclaimer, the term of this patent is extended or adjusted under 35 U.S.C. 154(b) by 871 days.

(21) Appl. No.: 13/991,886

(22) PCT Filed: Dec. 6, 2011

(86) PCT No.: PCT/EP2011/071960
§ 371 (c)(1),
(2), (4) Date: Aug. 23, 2013

(87) PCT Pub. No.: WO2012/076545
PCT Pub. Date: Jun. 14, 2012

(65) Prior Publication Data
US 2013/0328562 A1    Dec. 12, 2013

(30) Foreign Application Priority Data
Dec. 6, 2010    (FR) ..................................... 10 60142

(51) Int. Cl.
*G01R 33/48*    (2006.01)
*G01R 33/483*    (2006.01)

(52) U.S. Cl.
CPC ....... *G01R 33/483* (2013.01); *G01R 33/4831* (2013.01)

(58) Field of Classification Search
CPC ............. G03G 33/483; G03G 33/4831; G01R 33/307; G01R 33/34023; G01R 33/34092; G01R 33/3415; G01R 33/3657; G01R 33/385; G01R 33/445; G01R 33/4835; G01R 33/54; G01R 33/5659
See application file for complete search history.

(56) References Cited

U.S. PATENT DOCUMENTS

2003/0189426 A1* 10/2003 Kwok ................ G01R 33/3657
                                                               324/322
2007/0188171 A1    8/2007 Garwood et al.
2008/0116889 A1    5/2008 Hu et al.

FOREIGN PATENT DOCUMENTS

EP    2233940    3/2010

OTHER PUBLICATIONS

Magic Angle Effect, What is the magic angle.*
(Continued)

*Primary Examiner* — Clayton E Laballe
*Assistant Examiner* — Ruifeng Pu
(74) *Attorney, Agent, or Firm* — Blakely Sokoloff Taylor & Zafman LLP

(57) ABSTRACT

A method and apparatus for characterizing a sample using a nuclear magnetic resonance spectrometer in which an effective field is generated. The field has an effective vector and results from a static magnetic field and a radiofrequency magnetic field. The effective vector rotates relative to a terrestrial reference frame.

9 Claims, 6 Drawing Sheets

(56) References Cited

OTHER PUBLICATIONS

Weigan F. et al.; "Application of nuclear magnetic resonance magic sandwich echo imaging to solid polymers"; Solid State Nuclear Magnet Resonance Elsevier Science BV; Apr. 1, 1994; vol. 3, No. 2; pp. 59-66.

* cited by examiner

METHOD FOR CHARACTERIZING A SAMPLE BY NMR SPECTROSCOPY WITH ACQUISITION DURING THE GENERATION OF A RADIOFREQUENCY MAGNETIC FIELD

TECHNICAL FIELD

The invention relates to the field of methods for characterizing an object (material, biological sample, or entire biological system in vivo or in vitro) by means of a nuclear magnetic resonance spectrometer. The invention also relates to the field of nuclear magnetic resonance spectrometry apparatuses for acquiring the magnetization of an object as defined above.

PRIOR ART

In order to be able to study an object in nuclear magnetic resonance (NMR) spectrometry, it may be necessary to suppress or limit the influence of certain interactions occurring between the atoms making up the object to be studied, for example the dipolar and/or quadrupolar interaction between the nuclei of the atoms.

Suppression of these interactions between nuclei is generally carried out by averaging.

For a liquid such as water contained in the large majority of biological tissues, the molecules move and are subject to rotations, randomly along all the directions (this is designated as the Brownian movement). This Brownian movement is sufficiently rapid so that on average, the dipolar interactions to which the atoms are subject are considered as equal to zero or relatively small.

This is why NMR spectrometry is relatively simple to set up for studying liquid objects.

On the other hand, NMR spectrometry for studying a solid object is only possible provided that this object is placed under circumstances allowing artificial recreation of the averaging effect of the interactions so that from the point of view of NMR, the object may be assimilated to a liquid.

Indeed, in a solid, the Brownian movement is not sufficiently rapid to allow the dipolar and/or quadrupolar interactions perceived by the nuclei to equal to zero on average.

Notably, the non-zero dipolar interaction will make it possible for to the nuclei of the constitutive atoms of the solid to interact with each other and to distribute their spin in all the directions. The vector sum (magnetization) of the spins is then zero.

The cancelling of the magnetization occurs even more rapidly when the dipolar interaction is strong. Often, the dipolar interaction is sufficiently strong for the magnetization to be cancelled out too rapidly to be usable (measurable).

Dipolar and quadrupolar interactions between two atom nuclei are proportional to $1-3\cdot\cos^2(\theta)$, wherein $\theta$ is an angle formed by an applied static magnetic field and a vector connecting the centres of both nuclei. Thus, in order to cancel out the effects of these interactions, it is sufficient that the average of $1-3\cdot\cos^2(\theta)$ may be considered as equal to zero. If the angle $\theta$ is on average equal to $\theta_m = \arccos(3^{-1/2})$ or $\pi-\arccos(3^{-1/2})$ (i.e. approximately 54.74°) then the average of $1-3\cdot\cos^2(\theta)$ is zero. This angle $\theta_m$ is called a magic angle. In order to obtain an average of $\theta_m$ for the angle $\theta$ the solid material is subjected to rapid rotation around an axis forming an angle $\theta_m$ with the vector of the static magnetic field required for NMR spectrometry. The faster the rotation, the more effective the averaging effect of the interactions is and the closer one gets to the behavior of a liquid sample and therefore the better the resolution of the measurements is. The measurement is conducted in an Earth reference system which is that of the laboratory.

This spectroscopy technique adapted to solids is called Magic Angle Spinning (MAS).

A major drawback of this method is the requirement of rotating the object. Within the scope of suppressing the dipolar interaction, in order to obtain sufficient resolution, the rotation is performed at a frequency comprised between 1 Hz and 40 kHz. It is therefore not possible to use this method in vivo, for studying human subjects for example.

Further, these speeds of rotation even at a frequency of 40 kHz are sometimes still too slow for the quadrupolar interaction possibly present in the object to be considered as averaged to zero.

A second method, known from document US 2008/0,116,889, gives the possibility of doing without the requirement of rotating the solid material to be studied for "suppressing" the dipolar interaction.

In this second method, it is the main magnetic field (normally a static field) in which the material (equivalent to the static magnetic field of the previous method) is placed that undergoes rotation. Rotation of the main magnetic field is obtained by setting magnets into rotation. The rotation of the main magnetic field then creates the condition required for cancelling out the average of $1-3\cdot\cos^2(\theta)$.

The major drawback of this method is the requirement of setting the magnets of heavy mass into rotation. Indeed, in a conventional NMR spectrometer, the magnet, whether this is a superconducting or resistive magnet, enabling generation of the static magnetic fields, is characterized by a mass of several hundred kilograms or even several metric tons. It is then understood that even at frequencies of only a few hertz, setting parts of several metric tons into rotation involves a highly significant and costly technological modification of present NMR spectrometers.

Another technique called Magic Echo Pulse Sandwich (MEPS) technique, may be used on solid objects without requiring the use of mobile parts. This latter technique is based on the fact that, when, in addition to the static magnetic field $B_0$, a radiofrequency field $B_1$ is applied, the field perceived by the atoms is an effective field $B_{eff}$ for which the geometrical characteristics are given by the equation:

$$\vec{B}_{eff} = \vec{B}_1 + \left(B_0 - \frac{v_1}{\bar{\gamma}}\right)\hat{z};$$

wherein $v_1$ is the frequency of the applied radiofrequency field $B_1$, $\vec{B}_0 = B_0\hat{z}$, and $\bar{\gamma}$ is the gyromagnetic ratio of the studied nucleus expressed in Hz·T$^{-1}$ ($\gamma = 2.68 \cdot 10^8$ rad·Hz/T and $$\bar{\gamma} = \frac{\gamma}{2\cdot\pi}).$$

When the frequency $v_1$, at which the field $B_1$ is applied, is equal to $\bar{\gamma}\cdot B_0$ (resonance frequency of the relevant atoms), the effective field $B_{eff}$ perceived by the atoms is equal to the radiofrequency field $B_1$. It may be demonstrated that under these conditions, the dipolar interaction perceived by the atoms is $-\frac{1}{2}$ times the dipolar interaction that they perceive in the absence of the radiofrequency field $B_1$. The principle of MEPSes gives the possibility of cancelling out the dipolar interaction at a given instant. For this, during a portion of the measurement the atoms are left to freely evolve for a duration τ, a duration during which they are subject to a dipolar interaction of value $H_d$. These atoms are then subject for a duration 2τ, to a radiofrequency field $B_1$ applied at frequency $\bar{\gamma} \cdot B_0$ so that they are subjected during this duration 2τ to a dipolar interaction of value $-\frac{1}{2} H_d$. Under these conditions, at instant 3τ, the magnetization is totally rid of the dipolar interaction (i.e. over the whole of the atoms, the influence of the dipolar interaction is zero, as if the magnetization had been subjected to no dipolar interaction). It is at this instant 3τ that the signal is acquired.

This technique has the advantage of artificially rotating the effective field applied to the atoms thanks to the generated effective magnetic field $B_{eff}$. It also has the advantage of recreating the conditions for cancelling out the dipolar and quadrupolar interaction.

On the other hand, this condition is only achieved at the single instant 3τ; a single point of the signal then meets the condition of zero dipolar interaction. Now, if the dipolar and quadrupolar interactions are significant, the measurements carried out a few microseconds around the instant 3τ may already be too marred by the dipolar and/or quadrupolar interactions for their being utilized.

Thus, with this technique, in order to acquire a signal totally rid of the dipolar interaction, a point-by-point acquisition of this signal has to be carried out for different values of the duration τ and by making sure that for each acquired point at instant 3τ, the condition of evolution, in which the atoms are in free evolution (i.e. subject to $H_d$) for a duration τ and in an evolution imposed by the static field $B_0$ (i.e. subject to $-\frac{1}{2} H_d$) for a duration 2τ, is met.

The acquisition of a signal for a solid sample is therefore accomplished point-by-point with this technique. It is therefore much slower (by an order of a hundred to a thousand) than that using MAS.

SUMMARY

An object of the invention is to allow NMR spectrometry of solid objects or objects including solid portions, in a rapid and non-destructive way.

To this aim, the invention provides a method for characterizing a sample by means of a nuclear magnetic resonance spectrometer comprising an enclosure in which the sample is placed, a static magnetic field generator, a radiofrequency magnetic field generator, and at least one sensor, the method comprising the following steps:
generating in the enclosure, by the static magnetic field generator, a static magnetic field with a static vector;
generating in the enclosure and for a determined duration, by the radiofrequency magnetic field generator, a radiofrequency magnetic field with a radiofrequency vector;
wherein the method further comprises the step for acquiring, through at least one sensor, a magnetization of the sample for the determined duration; and
wherein an effective vector, to which the magnetization of the sample is subjected for the determined duration, is rotating relatively to an Earth reference system for the determined duration, the effective vector resulting from the static and radiofrequency magnetic fields, and the sample being fixed relatively to the Earth reference system.

An advantage of this method is that it is neither necessary to set the sample into rotation nor set the static magnetic field into rotation (equivalent to the main magnetic field).

Thus, it is possible to conduct in vivo studies of objects (for example animal or even human subjects) without requiring the modification of the enclosure housing one or several magnets which generate the static magnetic field.

Another advantage of this method is that the sample is placed under conditions for which the dipolar interaction is equal to zero for each atom (and not only its influence on the totality of the sample) and this for the whole duration of the acquisition.

Other optional and non-limiting features are:
the radiofrequency magnetic field is modulated so that the effective field applied to the sample has its effective vector given by $$\vec{B}_{eff} = \vec{B}_1 + \left(B_0 - \frac{v_1}{\gamma}\right)\hat{z}$$

and defining an angle ($\lambda_m$) of approximately 54.74° with the static vector,
$v_1$ being a frequency close to the Larmor frequency $v_0$ due to the static magnetic field, this frequency $v_1$ being due to the radiofrequency magnetic field;
the effective vector is rotating in a plane orthogonal to the static vector;
the effective vector is rotating in a plane orthogonal to the static vector at the Larmor frequency; and
acquisition of the magnetization of the sample is carried out by at least two sensors; a first sensor placed so as to acquire magnetic signals which are collinear with the static vector, having a frequency close to the effective frequency, and at least one second sensor placed so as to acquire magnetic signals which are collinear to the plane orthogonal to the static vector, having a frequency close to the Larmor frequency.

The invention also provides a nuclear magnetic resonance spectrometry apparatus for acquiring a magnetization of a sample comprising:
a sample holder fixed in an Earth reference system during the operation of the apparatus;
an enclosure in which the sample holder is placed;
a static magnetic field generator for generating a magnetic field with a static vector in the enclosure;
a radiofrequency magnetic field generator for generating a radiofrequency magnetic field with a radiofrequency vector in the enclosure for a determined duration;
wherein the apparatus further comprises at least one sensor for measuring the magnetization of a sample for the determined duration.

Other optional and non-limiting features are:
the radiofrequency magnetic field generator comprises at least two magnets or coils each generating a radiofrequency magnetic field so that the effective magnetic field, resulting from both radiofrequency magnetic fields of the magnets or coils and from the static magnetic field, has a rotating effective vector in the Earth reference system;
a first sensor is placed following the static vector and adjusted so as to acquire signals at frequencies close to an effective frequency resulting from an effective magnetic field applied to the sample such that:

$$\vec{B}_{eff} = \vec{B}_1 + \left(B_0 - \frac{v_1}{\gamma}\right)\hat{z};$$

$v_1$ being a frequency close to the Larmor frequency due to the static magnetic field, the frequency $v_1$ being due to the radiofrequency magnetic field, and $\vec{B}_0 = B_0 \hat{z}$; and $$v_{eff} = \bar{\gamma} \cdot B_{eff},$$

$\bar{\gamma}$ being the characteristic gyromagnetic ratio of a studied atom nucleus;

two second sensors are placed in a plane orthogonal to the static vector and adapted for acquiring a signal at a Larmor frequency due to the static magnetic field with:

$$v_0 = \bar{\gamma} \cdot B_0,$$

$\bar{\gamma}$ being the characteristic gyromagnetic ratio of a studied atom nucleus;

the static magnetic field generator, the radiofrequency magnetic field generator and the sensor(s) are fixed in the Earth reference system during the operation of the apparatus.

PRESENTATION OF THE DRAWINGS

Other features, objects and advantages will become apparent upon reading the detailed description which follows, with reference to the drawings given as an illustration and not as a limitation, wherein.

Figure 6:
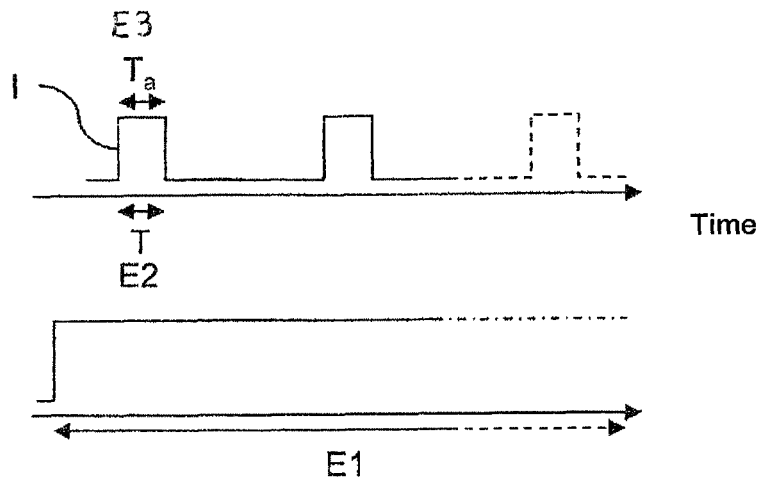
Figure 5:
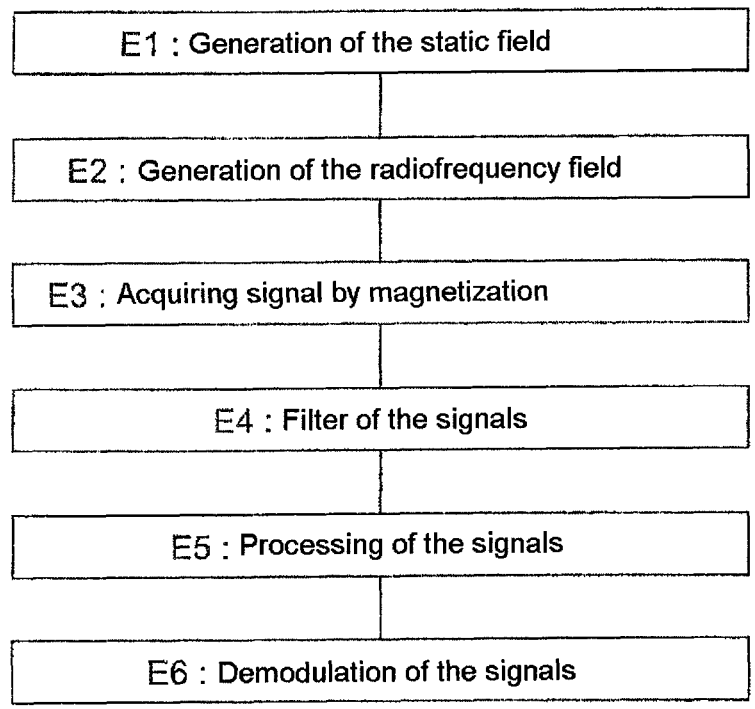
Figure 7:
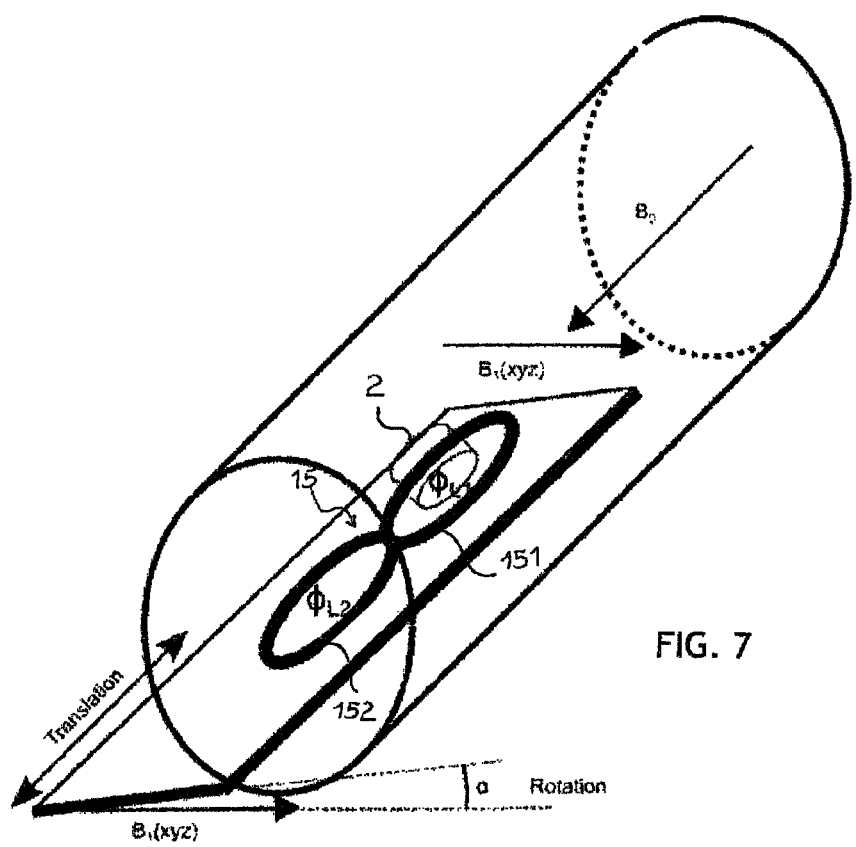
Figure 8:
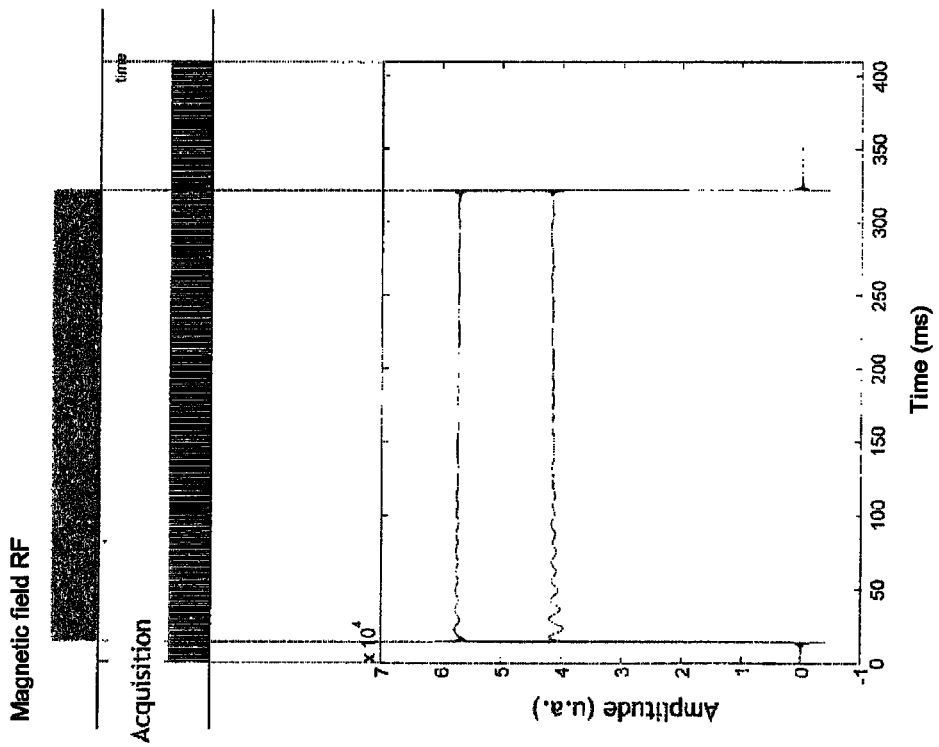
Figure 9:
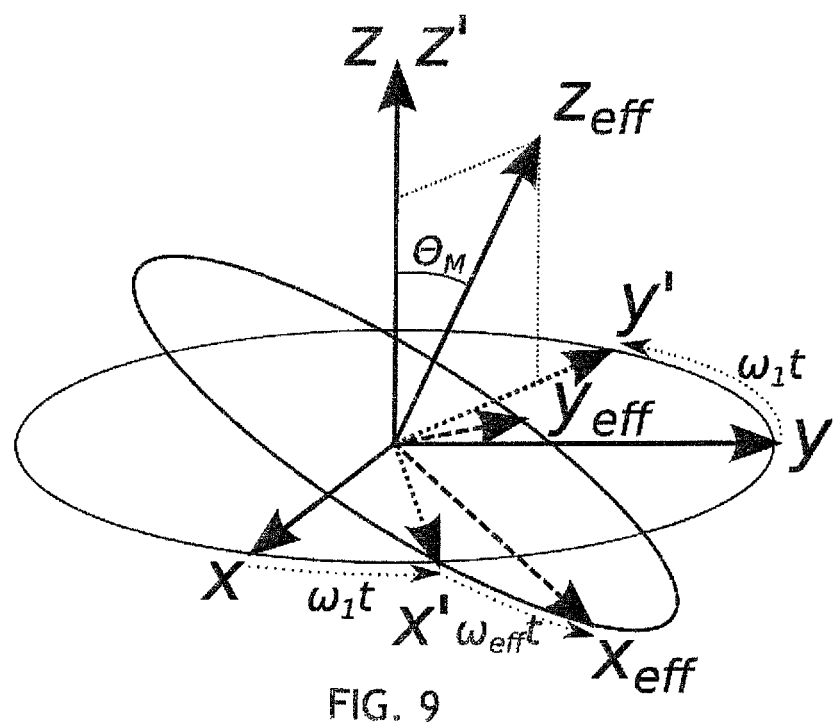

FIG. 5 schematically shows an exemplary embodiment of the method of the invention;

FIG. 6 is a time diagram showing the generated magnetic fields (at the top, the radiofrequency magnetic field and at the bottom, the static magnetic field) as well as the acquisition step during the application of the method of FIG. 5;

FIG. 7 illustrates the decoupling of the surface antenna of the "butterfly" type and of the linear volumetric coil;

FIG. 8 illustrates an acquisition step as a time diagram accompanied by the form of the acquired signals; and FIG. 9 shows the different reference systems and their relationship during the application of the present invention.

DETAILED DESCRIPTION

Principle of NMR Spectrometry

The standard method for acquiring signals in NMR spectrometry is described hereafter.

Generally, Nuclear Magnetic Resonance spectrometry (NMR spectrometry) consists of acquiring a signal proportional to the sum of the spin magnetic moments of the atoms of an element contained in an object placed in a magnetic field, for example hydrogen $^1H$ atoms (this spectrometry is then said to be proton NMR), deuterium atoms ($^2H$), carbon 13 ($^{13}C$) atoms, etc. Conventionally a spin magnetic moment is represented as a vector having a defined direction and a norm. Each relevant atom has a spin magnetic moment. The vector sum of the spin magnetic moments of a material is called its magnetization.

In the absence of any applied magnetic field, the spin magnetic moments of the studied atoms are randomly oriented in space. The magnetization is then zero on average.

The magnetic field in which is placed the material consists of a static magnetic field with respect to an Earth reference system which is that of the laboratory, and of a radiofrequency magnetic field. The static magnetic field is permanently applied onto the sample all along the experiment. The radiofrequency magnetic field is applied in a pulsed way (i.e. briefly for a determined duration). The magnetization of the object is measured in the absence of a radiofrequency field.

Figure 1A:
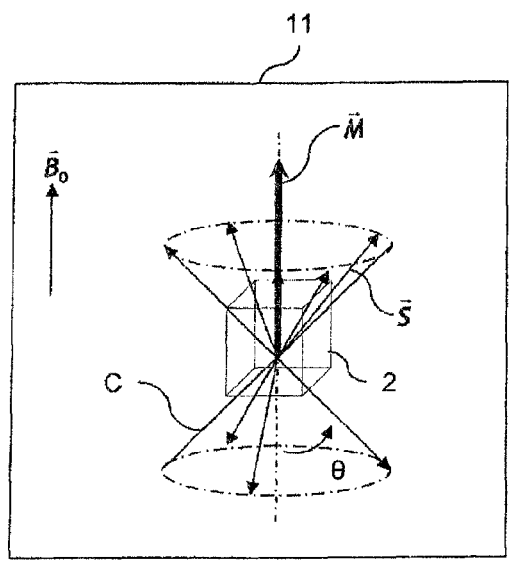
FIGS. 1a to 1c are detailed illustrations of the effects of the magnetic fields customarily used in NMR spectrometry on the spin magnetic moments of the studied atom nucleus.
Figure 1B:
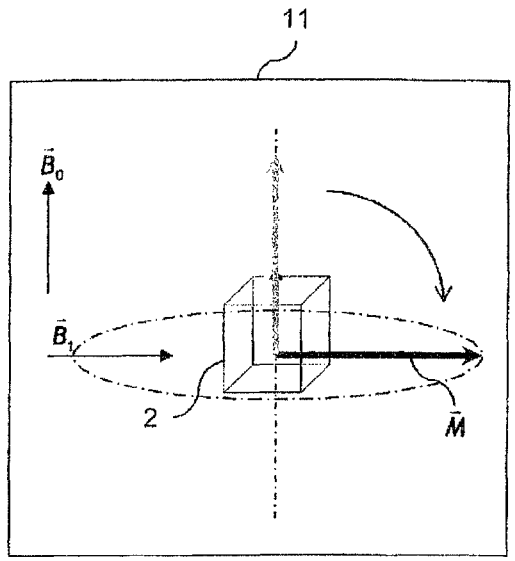
Figure 1C:
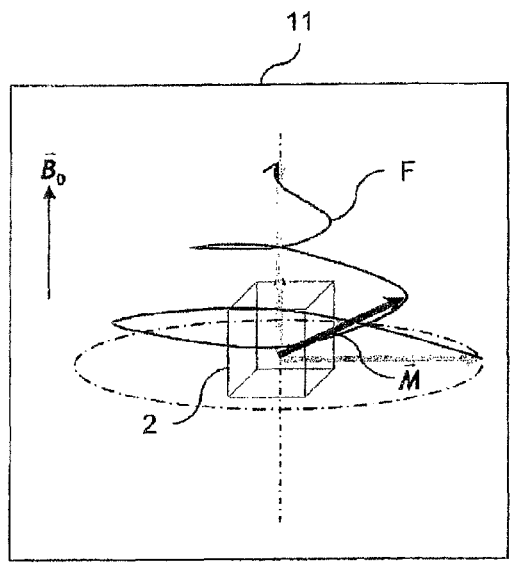

FIGS. 1a to 1c illustrate the known technique of NMR which consists of generating a static magnetic field $B_0$ according to a static vector $\vec{B}_0$ continuously in an enclosure 11 in which an object 2 of the studied material is placed, of generating a radiofrequency magnetic field $B_1$ as a radiofrequency pulse with a radiofrequency vector $\vec{B}_1$ for a determined duration T in the enclosure A2, and of acquiring the magnetization $\vec{M}$ of the sample A1 after a predetermined evolution duration. The amplitude of the static magnetic field $B_0$ is of the order of a tesla while that of the radiofrequency magnetic field is at the very most of the order of a millitesla.

FIG. 1a shows the influence of the static magnetic field $B_0$ on the spin magnetic moments of the atoms (represented by vectors $\vec{S}$ having as an origin a common point in space).

Under the action of the static magnetic field $B_0$, the angle formed by each of the spin magnetic moments $\vec{S}$ of the atoms with the static vector $\vec{B}_0$ is set and these spin magnetic moments $\vec{S}$ perform a precession movement around the static vector $\vec{B}_0$. The link between the intensity of the static field $B_0$ and the frequency of rotation $v_0$ of the magnetizations is given by the relationship:

$$v_0 = \bar{\gamma} \cdot B_0;$$

$\bar{\gamma}$ being called the gyromagnetic ratio of the relevant nucleus expressed in $Hz \cdot T^{-1}$.

It may be demonstrated that under these conditions, the vector sum of all the spin magnetic moments $\vec{S}$ is then no longer zero on average. This sum of spin magnetic moments $\vec{S}$ gives the magnetization $\vec{M}$ of the material which is on average non-zero and along the defined direction of the static vector $\vec{B}_0$.

FIG. 1b shows the influence of the radiofrequency magnetic field $B_1$ (represented by the radiofrequency vector $\vec{B}_1$, usually selected to be orthogonal to the static vector $\vec{B}_0$).

Under the action of the radiofrequency magnetic field $B_1$, the magnetization $\vec{M}$ of the material performs a rotation around the radiofrequency vector $\vec{B}_1$, the angle of which is proportional to the intensity and to the determined generation duration T of the radiofrequency magnetic field $B_1$. Usually, the duration T is selected so that the angle of rotation is 90° ($\pi/2$) or 180° ($\pi$). In an illustrative way, a rotation of 90° has been illustrated in FIG. 1b.

The magnetization $\vec{M}$ in fact performs a precession movement around the static vector $\vec{B}_0$ during the rotation of 90° or 180°.

FIG. 1c shows the evolution of the magnetization $\vec{M}$ of the material after the determined duration T, while the static magnetic field $B_0$ continues to be generated and while the radiofrequency magnetic field $B_1$ is no longer generated.

As soon as the radiofrequency magnetic field $B_1$ is no longer applied in the enclosure 11, the magnetization $\vec{M}$ will return to the equilibrium state by loss of energy. This return to the equilibrium state is accomplished according to a precession movement (see the arrow F in FIG. 1c) at a frequency specific to each of the spin magnetic moments $\vec{S}$ composing the object.

Figure 2:
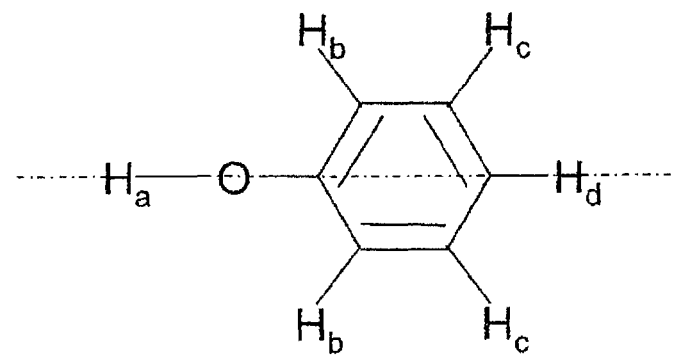
FIG. 2 is a schematic illustration of a phenol molecule taken as an example in the "principle of NMR spectrometry" part of the description.

The frequency of the magnetic signal generated by the return to equilibrium state of an atom is not the same for the same element if the latter may be found in different electron environments. For example, phenol comprises 6 hydrogen atoms $H_a$, $H_b$, $H_c$, $H_d$, but the spin magnetic moments $\vec{S}$ of each of the atoms will not all return to the equilibrium state at the same frequency. There are four groups of hydrogen atoms (see FIG. 2): the hydrogen atom $H_a$ bound to the oxygen atom O, the hydrogen atoms $H_b$ in the so-called "ortho" position, the hydrogen atoms $H_c$ in the so-called "meta" position and the hydrogen atom $H_d$ in the so-called "para" position. Each of the groups will experience its spin magnetic moment $\vec{S}$ returning to the equilibrium state at a frequency different from that of the other groups since their electron environments are different. Nevertheless, these differences are minimal. In spite of this they may all be detected distinctly.

The total acquired signal is then a sum of the magnetic signals of various frequencies. A Fourier transform may show these different frequencies, thereby forming an NMR spectrum of the sample.

Hereafter, only for the purposes of illustrations, proton NMR spectrometry (i.e. for hydrogen $^1$H) will be taken as an example. This does not limit the invention to proton NMR spectrometry alone, but one skilled in the art will easily be able to adapt the description which follows to NMR spectrometry of other atoms.

For the magnetic fields, $\vec{B}$ represents the vector of the magnetic field and B represents the amplitude of the associated vector and also refers to the magnetic field.

Apparatus

Figure 3:
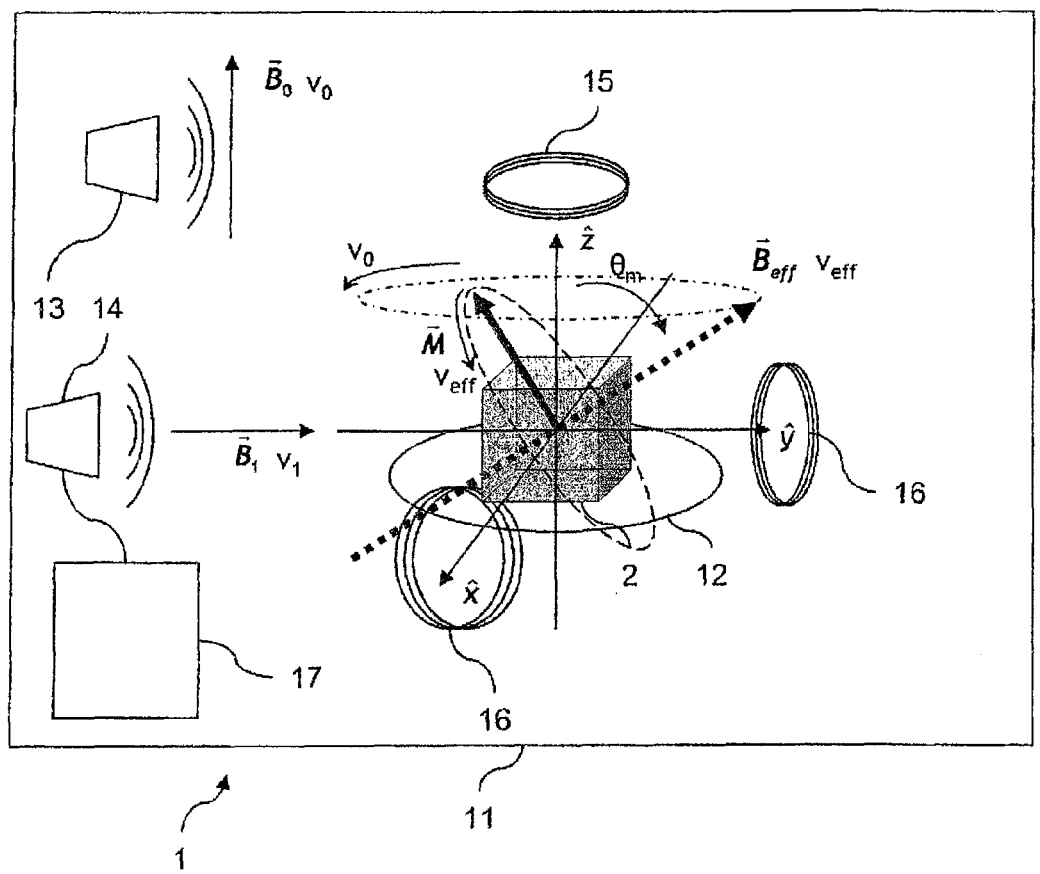
FIG. 3 is a schematic illustration of an apparatus according to an embodiment of the invention.
Figure 4:
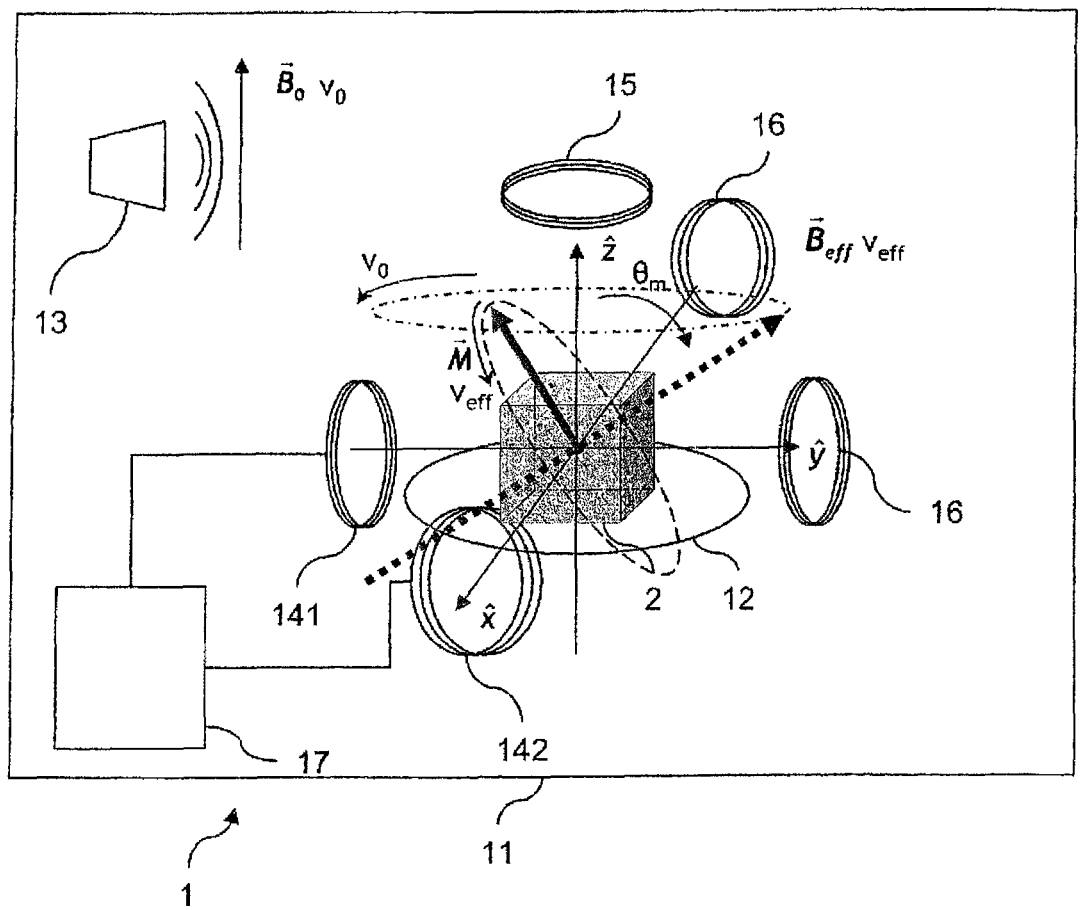
FIG. 4 is a schematic illustration of a particular embodiment of the apparatus of FIG. 3.

With reference to FIGS. 3 and 4, an NMR spectrometry apparatus 1 for acquiring a magnetization of a sample is described hereafter.

The NMR spectrometry apparatus 1 comprises a sample holder 12 for receiving the sample 2. The holder 12 is intended to remain fixed in an Earth reference system during the operation of the apparatus 1.

The apparatus 1 also comprises an enclosure 11 in which the sample holder 12 is placed. This enclosure 11 forms a volume in which magnetic fields will be generated.

The apparatus 1 further comprises a static magnetic field generator 13 for generating a static magnetic field $B_0$ in the enclosure 11 of static vector $\vec{B}_0$. The static magnetic field generator 13 is capable of generating a static magnetic field $B_0$ of an amplitude of the order of the tesla, typically between 0.1 T and 16 T. This static magnetic field $B_0$ gives the possibility of making the vector sum of the spin magnetic moments $\vec{S}$ of the hydrogen atoms non-zero along the line corresponding to the direction of the static vector $\vec{B}_0$ without however making the spin magnetic moments $\vec{S}$ individually collinear with the static vector $\vec{B}_0$. The sum of the spin magnetic moments $\vec{S}$ is the macroscopic magnetization $\vec{M}$, the latter is collinear with the static vector $\vec{B}_0$ and in the same defined direction. The spin magnetic moments $\vec{S}$ form with the static vector $\vec{B}_0$ fixed angles and perform a precession movement around the static vector $\vec{B}_0$ at the frequency of rotation $\nu_0$.

The apparatus also comprises a radiofrequency magnetic field generator 14 for generating a radiofrequency magnetic field $B_1$ in the enclosure 11 of radiofrequency vector $\vec{B}_1$. The radiofrequency magnetic field 14 is capable of generating a radiofrequency magnetic field with an amplitude comprised between a few microteslas (µT) and a few milliteslas (mT), typically between 1 µT and 1 mT, which corresponds to frequencies comprised between about 40 Hz and 40 kHz for the proton. The radiofrequency magnetic field $B_1$ is generated, for a determined duration T, as a pulse applied at the radiofrequency frequency $\nu_1$. The radiofrequency field $B_1$ is modulated so that the resultant of the static $B_0$ and radiofrequency $B_1$ magnetic fields as seen by the atoms rotates (see FIG. 9, where the laboratory reference system is labelled as (x, y, z), the reference system (x', y', z') rotating at the angular frequency $\omega_1$ around the axis $\hat{z}$, and the effective reference system ($x_{eff}$, $y_{eff}$, $z_{eff}$) rotating at the angular frequency $\omega_{eff}$ around the axis of the effective field $\vec{z}_{eff}$, $\vec{z}_{eff}$ being shifted by the magic angle relatively to the axis $\hat{z}'$ of the rotating reference system). This resultant is called an effective field $B_{eff}$ of effective vector $\vec{B}_{eff}$ and defined by:

$$\vec{B}_{eff} = \vec{B}_1 + \left(\vec{B}_0 - \frac{\vec{\nu}_1}{\bar{\gamma}}\right);$$

with $\bar{\gamma}$ the gyromagnetic ratio of the studied nucleus and the frequency vector $\vec{\nu}_1$ collinear with the static vector $\vec{B}_0$.

The radiofrequency magnetic field $B_1$ thus gives the possibility of rotating the magnetization $\vec{M}$ around the effective vector $\vec{B}_{eff}$.

The apparatus 1 comprises at least one sensor 15, 16 for acquiring the magnetization $\vec{M}$ of the sample during the generation of the radiofrequency magnetic field $B_1$. This acquisition is carried out for the determined duration T.

The apparatus 1 further comprises an actuator 17 for controlling the generation of the radiofrequency field $B_1$ in a sinusoidal way.

When the amplitude of the radiofrequency field $B_1$ as well as its application frequency $\nu_1$ verifies the relationship:

$$\arctan\left(\frac{B_1}{B_0 - \frac{\nu_1}{\gamma}}\right) = \theta_m;$$

$$B_1 = \left(B_0 - \frac{\nu_1}{\gamma}\right) \cdot \tan(\theta_m).$$

$\theta_m$ being the magic angle. The dipolar and quadrupolar interactions perceived by the object are on average equal to zero and by acquiring the signal during the application of the radiofrequency field $B_1$ with an amplitude and frequency defined above it is possible to get rid of the requirement of setting the sample 2 or the static magnetic field generator 13 into rotation. Thus, it is possible to study samples regardless of their state (notably solid, but also liquid, gas state or even a mixture thereof), or even study the tissues of an animal or of a human being in vivo.

The rotation frequency of the magnetization $\vec{M}$ (due to the rotating effective field $B_{\text{eff}}$) may be brought to a high value (of more than about a hundred kilohertz and optionally reaching one megahertz) as compared with the MAS prior art method which is confined to a few tens of kilohertz.

In an embodiment, the radiofrequency magnetic field generator 14 consists of a single magnet or coil. The actuator 17 then controls the radiofrequency magnetic field generator 14 for generating a radiofrequency field $B_1$ sinusoidally modulated in order to rotate the effective field $B_{\text{eff}}$.

In another embodiment, the radiofrequency magnetic field generator 14 may comprise at least two magnets or coils 141, 142 (see FIG. 4) each generating a partial radiofrequency field. This gives the possibility of obtaining a radiofrequency field $B_1$ for which the amplitude is more intense. The actuator 17 then controls the generation of the partial radiofrequency magnetic fields by both coils 141, 142, so that the effective field $B_{\text{eff}}$ resulting from both partial radiofrequency magnetic fields of the coils 141, 142 and from the static magnetic field $B_0$ has an effective vector $\vec{B}_{\text{eff}}$ rotating around the static vector $\vec{B}_0$ for the determined duration T. The partial radiofrequency magnetic fields are for example sinusoidally modulated and in phase quadrature relatively to each other (which amounts to having a partial radiofrequency magnetic field modulated by a sine function and the other one by a cosine function).

During the application of the radiofrequency field $B_1$, the frequency $v_1$ and the amplitude $B_1$ of which meet the condition:

$$\arctan\left(\frac{B_1}{B_0 - \frac{v_1}{\gamma}}\right) = \theta_m;$$

the spin magnetic moments $\vec{S}$ and therefore the resulting magnetization $\vec{M}$ perform a precession movement around the effective vector $\vec{B}_{\text{eff}}$ defined by:

$$\vec{B}_{\text{eff}} = \vec{B}_1 + \left(B_0 - \frac{v_1}{\gamma}\right)\hat{z}$$

This precession movement takes place at the frequency $v_{\text{eff}} = \bar{\gamma} \cdot B_{\text{eff}}$. The effective vector $\vec{B}_{\text{eff}}$ of the effective field $B_{\text{eff}}$ is itself rotating around the static vector $\vec{B}_0$ at the Larmor frequency $v_0 = \bar{\gamma} \cdot B_0$.

When the precession frequency around the effective field $B_{\text{eff}}$ is sufficiently large (i.e. of the same order as the frequencies used in MAS techniques, greater by a few hertz) an averaging of the dipolar and optionally quadrupolar interaction present in the object is obtained.

The virtual rotation frequency $v_{\text{eff}}$ responsible for the averaging of the dipolar and quadrupolar interactions being simply adjusted by the intensity of the applied radiofrequency field $B_1$, it is no longer neither the sample nor the static field $B_0$ which has to be set into rotation and tilted by the magical angle $\theta_m$ but only the effective field $B_{\text{eff}}$; this latter operation being carried out by suitably selecting the frequency $v_1$ and the amplitude of the radiofrequency field $B_1$. It is simple to give $B_1$ amplitudes ranging from a few $\mu T$ up to one mT, these amplitudes generating a virtual rotation frequency $v_{\text{eff}}$ ranging from a few Hz to several tens of kHz.

Thus, all the portions of the apparatus 1 remain fixed during its operation. Therefore this does not induce any mechanical wear of the apparatus 1 and considerably limits the risks of failures or of poor handling.

A first sensor 15 may be placed along the static vector $\vec{B}_0$ and be adjusted so as to detect frequencies around the effective frequency $v_{\text{eff}}$. The effective frequency $v_{\text{eff}}$ is due to the effective magnetic field of $B_{\text{eff}}$ seen by the sample 2. The effective magnetic field $B_{\text{eff}}$ results from the combination of the static $B_0$ and radiofrequency $B_1$ magnetic fields (without taking into account the electron environment of the hydrogen atom), and has the formula given by the following relationship:

$$\vec{B}_{\text{eff}} = \vec{B}_1 + \left(B_0 - \frac{v_1}{\gamma}\right)\hat{z}$$

The frequency $v_1$ is the application frequency of the field $B_1$, this is a frequency close to the Larmor frequency of the studied nucleus $v_0 = \bar{\gamma} B_0$.

The following relationship gives the effective frequency $v_{\text{eff}}$:

$$v_{\text{eff}} = \bar{\gamma} \cdot B_{\text{eff}}.$$

Thus, the first sensor 15 allows acquisition of the signals frequencies close to the effective frequency $v_{\text{eff}}$ which correspond to the signals resulting from the precession movement of the spin magnetic moments $\vec{S}$ of the hydrogen atoms of the sample 2 around the effective field $B_{\text{eff}}$.

Two second sensors 16 may be placed in a plane orthogonal to the static vector $\vec{B}_0$ and adapted so as to acquire signals at the Larmor frequency $v_0$.

The sensor(s) 15, 16 are decoupled from the generator(s) 14; 141, 142 of the radiofrequency magnetic field $B_1$. This decoupling may be achieved geometrically or electronically. An example is given below.

The use of the first and second sensors 15, 16 gives the possibility of acquiring the variations of the magnetization $\vec{M}$ along the three spatial dimensions in the reference system of the laboratory.

Generally, the configuration of the sensors may be selected from the following configurations:
- a single sensor for acquiring signals at a frequency close to or equal to the Larmor frequency $v_0$;
- two orthogonal sensors for acquiring signals at a frequency close or equal to the Larmor frequency $v_0$;
- two sensors, one of which for acquiring signals at a frequency close or equal to the Larmor frequency $v_0$; and one for acquiring signals at a frequency close or equal to the effective frequency $v_{\text{eff}}$;
- three sensors, two of which for acquiring signals close or equal to the Larmor frequency $v_0$ and one for acquiring signals at a frequency close or equal to the effective frequency $v_{\text{eff}}$.

Method

With reference to FIGS. 5 and 6, a method for characterizing a sample by means of an NMR spectrometry apparatus described above, is described hereafter.

Prior to the method, a sample 2 is placed on the holder 12 of the NMR apparatus 1, inside the enclosure 11.

The method comprises generating E1 in the enclosure 11 of the apparatus 1, by the static magnetic field generator 13, a static magnetic field $B_0$ of static vector $\vec{B}_0$ collinear with a unit vector $\hat{z}$.

The method also comprises generating E2 in the enclosure 11, by the radiofrequency magnetic field generator 14, a radiofrequency magnetic field $B_1$ of radiofrequency vector $\vec{B}_1$. The radiofrequency magnetic field $B_1$ is generated for a determined duration T, as a pulse I.

The amplitude $B_1$ of the radiofrequency magnetic field $B_1$ of frequency $v_1$ is given by the relationship:

$$\arctan\left(\frac{B_1}{B_0 - \frac{v_1}{\gamma}}\right) = \theta_m;$$

$\theta_m$ being the magic angle.

The radiofrequency magnetic field $B_1$ is, for the determined duration T, modulated so that an effective field $B_{eff}$ seen by the atoms of the object results from the static $B_0$ and radiofrequency $B_1$ magnetic fields, is of an effective vector $\vec{B}_{eff}$ rotating relatively to an Earth reference system, such that:

$$\vec{B}_{eff} = \vec{B}_1 + \left(B_0 - \frac{v_1}{\gamma}\right)\hat{z}.$$

The effective vector $\vec{B}_{eff}$ of the effective field $B_{eff}$ performs a precession movement around the static vector $\vec{B}_0$ at frequency $v_0$. The radiofrequency field $B_1$ was selected so that the effective vector $\vec{B}_{eff}$ forms a magic angle of $\theta_m = 54.74°$ with the static vector $\vec{B}_0$.

The radiofrequency magnetic field $B_1$ may only comprise a single sinusoidally modulated component. In this case, only the effective vector $\vec{B}_{eff}$ rotates in the Earth reference system.

The radiofrequency magnetic field $B_1$ may also comprise two sinusoidally modulated components in phase quadrature. In this second case, the radiofrequency $\vec{B}_1$ and effective $\vec{B}_{eff}$ vectors rotate in an Earth reference system.

By applying the effective field $B_{eff}$ forming the magic angle $\theta_m$ with the static field of $B_0$, it is possible to get rid of the requirement of setting the sample 2 or the static magnetic field generator 13 into physical rotation. Thus, it is possible to study samples regardless of their state (notably solid, but also liquid, gas state or even a mixture thereof), or even study the tissues of an animal or of a living human being.

Further, the rotation frequency of the magnetization $\vec{M}$ (due to the rotating effective field $B_{eff}$ and proportional to the effective frequency $v_{eff}$) may be raised to a high value, which may exceed one megahertz, as compared with the prior art which is limited to a few tens of kilohertz.

The experimenter selects the virtual rotation speed, proportional to the effective frequency $v_{eff}$, which is intended to be imposed to the sample. Once this effective speed of rotation is selected (between a few hertz and one megahertz), the amplitude of the radiofrequency field $B_1$ as well as its frequency $v_1$ are found by solving the system of equations:

$$\begin{cases} B_1^2 + \left(B_0 - \frac{v_1}{\gamma}\right)^2 = B_{eff}^2 \\ B_1 = \sqrt{2} \cdot \left(B_0 - \frac{v_1}{\gamma}\right); \end{cases}$$

with $B_0$, $B_{eff}$ and $\bar{\gamma}$ being known.

The method further comprises a step E3 for acquiring by at least one sensor 15, 16 a magnetization $\vec{M}$ of the sample 2. This acquisition step E3 is carried out for the determined duration T and lasts for an acquisition time $T_a$ comprised in the determined duration T (see FIG. 6).

For example, two decoupled antennas (or coils) are used: a first antenna 14 is a linear volumetric coil (for example a Rapidbiomedical V-HLS-047 model) for emitting the radiofrequency magnetic field and a second one 15 is a surface antenna of the "butterfly" type for reception.

The decoupling of both coils 14, 15 is achieved according to two steps. First of all, a rotation of angle $\alpha_{optimum}$ is applied to the plane of the butterfly antenna in order to make the butterfly antenna as parallel as possible to the radiofrequency vector $\vec{B}_1$ generated by the emitting antenna 14. This minimizes the flux of the radiofrequency magnetic field $B_1$ through both loops of the butterfly antenna to a residual flux. And then, the butterfly antenna is translationally displaced inside the emitting antenna 14. Thereby making the most out of the non-uniform nature of the radiofrequency magnetic field $B_1$, it is possible to find a position in which the flux difference between both loops 151, 152 of the butterfly antenna 15 may cancel out the residual flux.

Moreover, in this case, the sample 2 may be positioned inside a first loop 151 of the butterfly antenna (see FIG. 7). Thus, the flux produced by the magnetization of the sample is maximum in the first loop 151 and almost equals to zero in the second loop 152.

Thus, by means of this method, it is possible to get rid of the requirement of conducting measurements point-by-point as imposed in the MEPS technique.

The acquisition step E3 may comprise the substep E31 for acquiring magnetic signals having a frequency close to the effective frequency $v_{eff}$. This low frequency signal gives information on the time-dependent change of the magnetizations according to the axis of the static field $B_0$.

The acquisition step E3 may also comprise the substep E32 for acquiring magnetic signals having a frequency close to the Larmor frequency $v_0$. With this step it is possible to monitor changes of the signal over time in the plane perpendicular to the static vector $\vec{B}_0$.

The signals collected by the sensors 15, 16 may then be filtered E4 in order to remove parasitic signals from the generators 13, 14; 13, 141, 142 of magnetic fields.

The connected signals are then processed E5 for reconstructing a three-dimensional signal describing over time the changes of the magnetization $\vec{M}$ of the sample 2. The three-dimensional signal may be put into the form of quaternion signal i.e. in the form of a signal for which each point is put into the form of a+ib+jc+kd with a, b, c, d being real and $i^2=j^2=k^2=ijk=-1$. At each instant t of the acquisition, the three-dimensional signal may be described in spherical coordinates by three parameters ($\rho$, $\theta$, $\phi$) corresponding to the amplitude, the latitude and colatitude of the signal. Finally a demodulation step E6 may be carried out on the three-dimensional signal in order to represent it in the Earth reference system according to a fixed reference system.

FIG. 8 illustrates a time diagram showing the acquisition of the signals during the emission of the radiofrequency magnetic field $B_1$. According to this particular time diagram, the acquisition is triggered before application of the radiofrequency magnetic field $B_1$ and the acquisition ends after having cut off the radiofrequency magnetic field $B_1$.

FIG. 8 also shows both acquired signals. The first at the top corresponds to the real part of the transverse magnetization while the second at the bottom corresponds to the complex part of this magnetization. Both oscillating and observable signals persist for a period of more than 300 ms, which is a relatively long time in the field of NMR acquisition. When the radiofrequency magnetic field is cut off, the observed signal disappears within only about 20 milliseconds.

The invention claimed is:

1. A method for characterizing a sample (2) by means of a Nuclear Magnetic Resonance spectrometer comprising an enclosure (11) in which the sample (2) is placed, a static magnetic field ($B_0$) generator (13), a radiofrequency magnetic field ($B_1$) (14), and at least one sensor (15, 16), the method comprising the following steps:
  (a) generating (E1) in the enclosure (11), by the static magnetic field generator (13) a static magnetic field ($B_0$) with a static vector ($\vec{B}_0$), the static magnetic field being comprised between 0.1 Tesla and 16 Tesla;
  (b) generating (E2) in the enclosure (11) and for a determined duration (T), by the radiofrequency magnetic field generator (14) a radiofrequency magnetic field ($B_1$) with a radiofrequency vector ($\vec{B}_1$);
  (c) acquiring (E3) by at least one sensor (15, 16), a magnetization ($\vec{M}$) of the sample (2)
  wherein the generator(s) and the sensor(s) are decoupled, the step of acquisition (E3) being achieved for all or part of the determined duration (T); and
  wherein an effective vector ($\vec{B}_{eff}$), to which the magnetization ($\vec{M}$) of the sample (2) is subjected for the determined duration (T), is rotating relatively to an Earth reference system for the determined duration (T), the effective vector ($\vec{B}_{eff}$) resulting from the static ($B_0$) and radiofrequency ($B_1$) magnetic fields, and the sample (2) being fixed relatively to the Earth reference system, the radiofrequency magnetic field being comprised between 1 MicroTesla and a few milliTeslas.

2. The method according to claim 1, wherein the radiofrequency magnetic field ($B_1$) is selected so that the effective field ($B_{eff}$) applied to the sample has its effective vector ($\vec{B}_{eff}$), given by $$\vec{B}_{eff} = \vec{B}_1 + \left(B_0 - \frac{v_1}{\gamma}\right)\hat{z}$$

and defining an angle ($\theta_m$) of approximately 54.74° with the static vector ($\vec{B}_0$)
  $v_1$ being a frequency close to the Larmor frequency $v_0$ due to the static magnetic field ($B_0$), this frequency $v_1$ being due to the radiofrequency magnetic field ($B_1$).

3. The method according to one of claims 1 and 2, wherein the effective vector ($\vec{B}_{eff}$) is rotating in a plane orthogonal to the static vector ($\vec{B}_0$).

4. The method according to claim 2, wherein the effective vector is rotating in a plane orthogonal to the static vector ($B_0$) at the Larmor frequency ($v_0$).

5. The method according to claim 4, wherein the acquisition (E3) of the magnetization ($\vec{M}$) of the sample (2) is carried out by at least two sensors (15, 16); a first sensor (15) placed so as to acquire magnetic signals collinear with the static vector ($\vec{B}_0$), having a frequency close to the effective frequency ($v_{eff}$), and at least one second sensor (16) placed so as to acquire magnetic signals collinear with the plane orthogonal to the static vector ($\vec{B}_0$), having a frequency close to the Larmor frequency ($v_0$).

6. A Nuclear Magnetic Resonance spectrometry apparatus for acquiring a magnetization ($\vec{M}$) of a sample (2) comprising:
  a sample holder (12) fixed in an Earth reference system during the operation of the apparatus (1);
  an enclosure (11) in which the sample holder (12) is placed;
  a static magnetic field generator (13) for generating a static magnetic field ($B_0$) with a static vector ($\vec{B}_0$) in the enclosure (11), the static magnetic field being comprised between 0.1 Tesla and 16 Tesla,
  a radiofrequency magnetic field generator (14) for generating a radiofrequency magnetic field ($B_1$) with a radiofrequency vector ($\vec{B}_1$) in the enclosure for a determined duration (T);
  at least one sensor (15, 16) for measuring the magnetization ($\vec{M}$)
  wherein the radiofrequency magnetic field generator (14) comprises at least two coils (141, 142) each generating a radiofrequency magnetic field so that the resulting total effective magnetic field ($B_{eff}$) resulting from both radiofrequency magnetic fields of the coils (141, 142) and from the static magnetic field ($B_0$) has an effective vector ($\vec{B}_{eff}$) rotating in the Earth reference system, the field ($\vec{B}_1$) the radiofrequency magnetic field being comprised between 1 microTesla and a few milliTeslas, and
  the generator(s) are decoupled from the sensors, the measuring of the magnetization of the sample (2) occurring for all or part of the determined duration (T).

7. The apparatus (1) according to claim 6, wherein a first sensor (15) is placed according to the static vector ($\vec{B}_0$) and adjusted so as to acquire signals at frequencies close to an effective frequency ($v_{eff}$) resulting from an effective magnetic field ($B_{eff}$) applied to the sample (2) such that:

$$\vec{B}_{eff} = \vec{B}_1 + \left(B_0 - \frac{v_1}{\gamma}\right)\hat{z};$$

$v_1$ being a frequency close to the Larmor frequency ($v_0$) due to the static magnetic field ($B_0$), the frequency $v_1$ being due to the radiofrequency magnetic field ($B_1$); and $$v_{eff} = \vec{\gamma} \cdot \vec{B}_{eff},$$

$\vec{\gamma}$ being the gyromagnetic ratio characteristic of a nucleus of a studied atom.

8. The apparatus (1) according to claim 6, wherein two second sensors (16) are orthogonally placed and are adapted for acquiring a signal at a Larmor frequency ($\nu_0$) due to the static magnetic field ($B_0$) with:

$$\nu_0 = \bar{\gamma} \cdot B_0,$$

$\bar{\gamma}$ being the gyromagnetic ratio characteristic of a nucleus of a studied atom.

9. The apparatus (1) according to one claim 6, wherein the static magnetic field generator (13), the radiofrequency magnetic field generator (14) and the sensor(s) (15, 16) are fixed in the Earth reference system during the operation of the apparatus (1).

* * * * *